United States Patent [19]

Lindmayer

[11] 3,990,097

[45] Nov. 2, 1976

[54] SILICON SOLAR ENERGY CELL HAVING IMPROVED BACK CONTACT AND METHOD FORMING SAME

[75] Inventor: Joseph Lindmayer, Bethesda, Md.

[73] Assignee: Solarex Corporation, Rockville, Md.

[22] Filed: Sept. 18, 1975

[21] Appl. No.: 614,619

[52] U.S. Cl. .................. 357/30; 357/58; 357/52; 357/71; 136/89
[51] Int. Cl.² .................. H01L 27/14
[58] Field of Search .......... 357/58, 30, 52, 71; 136/89

[56] References Cited
UNITED STATES PATENTS

| | | | |
|---|---|---|---|
| 3,604,987 | 9/1971 | Assour | 250/209 |
| 3,691,389 | 9/1972 | Ellis | 250/211 J |
| 3,697,825 | 10/1972 | Meuleman | 317/234 R |
| 3,769,558 | 10/1973 | Lindmayer | 317/234 |
| 3,781,612 | 12/1973 | Llaces | 317/234 R |
| 3,888,698 | 6/1975 | Lindmayer | 136/89 |
| 3,928,866 | 12/1975 | Digoy | 357/30 |

OTHER PUBLICATIONS

Gates et al., *I.B.M. Tech. Discl. Bull.*, vol. 8, No. 11, Apr. 1966, p. 1688.

*Primary Examiner*—Martin H. Edlow
*Attorney, Agent, or Firm*—Walter D. Ames

[57] ABSTRACT

A silicon solar energy cell having a diffusant junction extending inwardly from one surface, an aluminum-silicon junction of the opposite polarity extending inwardly from the other surface, and a film of aluminum-oxygen-diffusant formed over the aluminum-silicon junction. The structure is formed by diffusing an unprotected wafer, coating the diffusant glass so formed on one side of the wafer with aluminum, and heating the wafer.

5 Claims, 1 Drawing Figure

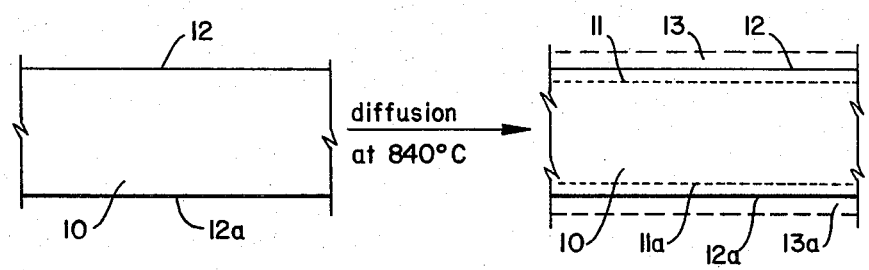
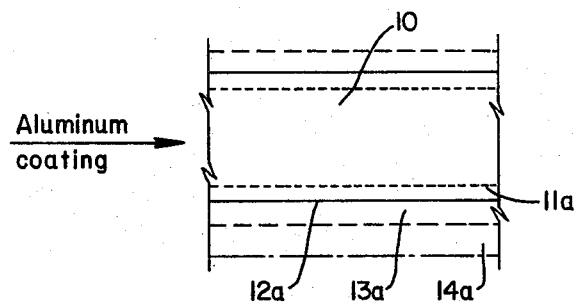
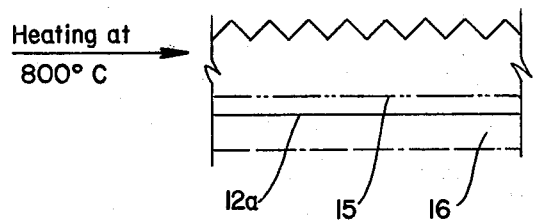

SILICON SOLAR ENERGY CELL HAVING IMPROVED BACK CONTACT AND METHOD FORMING SAME

This invention relates generally to the art of making solar energy cells from wafers of crystalline silicon. More specifically, it is directed to a method of forming a back junction and back contact on such a wafer and the silicon wafer so produced.

In the process of manufacturing silicon solar energy cells, an important step to be accomplished is the diffusion of different types of impurities into a silicon wafer so that junctions of different polarities will be formed adjacent each surface of the wafer. For p-type silicon wafers, the diffusion process usually employs phosphorus or arsenic as the diffusant, either or both of these impurities being diffused into the silicon material. A problem that arises is that, during the diffusion process, both sides of the relatively thin, substantially flat silicon wafers are exposed to the diffusant; therefore, a junction develops on both sides of the wafer. Since the junctions are the same, one of them has to be eliminated or modified while the other junction is maintained on the other side of the wafer.

Several methods of removing an undesirable junction or avoiding the formation of such a junction are known. Thus, the undesirable junction or the glass that has formed over it can be etched off with a strongly acid or basic material after a coating has been applied to that surface of the wafer on which the junction is to be preserved. Another way to remove an undesirable, diffused area is to polish that surface of the silicon wafer. Such polishing means that layers of glass and/or silicon have to be mechanically removed from the diffused silicon wafer, in this manner eliminating layers that have been undesirably affected by the diffusant.

Another solution to the problem that has been proposed is to coat one side of the wafer prior to diffusion with some material that does not permit penetration of the diffusant. In this manner a diffusant junction is formed on one side of the wafer only. Aluminum is known to be one of the materials which, when coated on a silicon surface, does not permit arsenic or phosphorus to diffuse itself into the underlying silicon surface. Further, the use of aluminum to form a plus plus junction in a wafer has been envisioned. To accomplish this purpose, the aluminum is alloyed into the silicon. However, when materials such as aluminum are coated directly onto a silicon wafer and a diffusion process is then effected, a complicated firing process is required in which the wafer has to pass through several zones of different temperatures in the furnace or the temperature must be changed periodically to compensate for the higher temperature at which the phosphorus or arsenic is usually diffused in comparison to the lower temperature of the aluminum alloying process. The optimum temperature profile is not easy to effect, and this method presents practical difficulties of wafer handling as well as increased capital expenditures.

It is, therefore, an important object of the present invention to overcome the difficulties faced by the art in removing or overcoming an unwanted junction on the back surface of silicon solar cell material. It is a further object to provide a process for forming a junction of proper polarity that requires neither the removal of diffused material from the back surface nor a complicated firing cycle to accommodate material on the back surface of the silicon wafer as well as the diffusant that may enter through the front surface of the wafer.

The above objects are accomplished by subjecting a crystalline silicon wafer to a diffusant without projecting the wafer. In this manner junctions are formed extending inwardly from both surfaces of the wafer and films of diffusant glass coat both surfaces. A coating of aluminum is then applied to the glass on that side of the wafer whose polarity is to be changed and the so-coated wafer is again heated. On such heating it has unexpectedly been found that the aluminum has in part passed through the diffusant glass to form an aluminum-silicon junction that replaces the diffusant junction and is of a polarity opposte thereto. Further, the glass that has been coated with aluminum now contains aluminum and has become electrically conductive. So, by failing to remove the diffusant glass before coating with aluminum, not only has an aluminum-silicon junction nevertheless been created, but the glass has been rendered conductive, thereby making optional the application of a layer of conductive metal, such as titanium-silver, titanium-gold or chromium, to that surface of the wafer.

In carrying out my novel method, the diffusing operation is performed at efficient temperature ranges, broadly at 750° to 900° C., more preferably at 820° to 860° C and optimally at 840° C. The aluminum alloying step is carried out at a temperature somewhat lower than the optimum temperature of diffusion, e.g., at about 800° C.

As formed, the new silicon solar energy cell precursor has a diffusant junction of one polarity extending inwardly from one surface, usually called the front surface of the wafer, an aluminum-silicon junction of the opposite polarity extending inwardly from the back surface of the wafer, and a zone of substantially undiffused silicon separating those junctions. An electrically conductive glass of aluminum, silicon and diffusant is formed on the back surface and may be used as the back contact, or a further metallic coating may be applied. If the diffusant utilized is phosphorus, the conductive glass on the back surface will contain aluminum, oxygen and phosphorus. Additionally, a phosphor-glass will have been formed on the front surface of the wafer.

These and other objects, features and advantages of my invention will become more apparent when considered in connection with the following description of a specific embodiment and best mode of my process and the product that is created as the process is performed. That description will be more readily understood when viewed in conjunction with the accompanying drawing that forms a part of this application, and in which the sole FIGURE is a flow diagram illustrating the method and the silicon wafer, from its initial form prior to treatment until, by means of my novel method, the wafer has a back contact and front and back junctions.

As illustrated, a silicon wafer of desired size, for example, a circular disc 3 inches in diameter and 10 mils in thickness, is subjected to diffusion with phosphine, oxygen and argon in an oven at a temperature of about 840° C for 12 minutes. In particular, I used 1% phosphine in argon at an input rate of 1200 cc/min, oxygen at 70 cc/min and argon at 650 cc/min. A uniform exhaust from the furnace was maintained.

After diffusion, that surface referred to for convenience as the front surface 12 of the wafer 10 had been diffused with a phosphorus junction 11 that extended inwardly some 2000A into the wafer. The front surface 12 had also been coated with a layer of phosphor-glass about 1000A thick, which glass is an insulator and gave the underlying surface a blue appearance. In a like manner, the back surface 12a of the wafer had a phosphor-glass coating 13a and a phosphorus-silicon junction 11a had been formed inwardly of the back surface.

Since in the present application the invention disclosed relates to the application of a back contact to the silicon wafer, further specific reference will not be made to the front surface of the wafer. A novel method of applying contacts to the front surface of the wafer is the subject of my application filed herewith and entitled, Method of Applying Contacts to a Silicon Wafer and Product Formed Thereby, application Ser. No. 614,618. That application should be referred to where necessary to augment the present disclosure.

A coating of aluminum 14a is now applied to the phosphorglass 13a by evaporation, although other known techniques can be used. The aluminum coating was about 5000A thick. Then the coated wafer was heated at 800° C., i.e., well above the alloying temperature of the aluminum, for 10 minutes, and a new junction or zone 15 was formed inwardly of the back surface 12a. Also formed was a new, electrically conductive layer 16 on that back surface. Although precise analysis has not been made, it is apparent that the back junction 15 is a combination of aluminum and silicon. The layer 16 is composed primarily of aluminum, oxygen and phosphorus. Since layer 16 is electrically conductive, it may serve as the back contact for the solar cell. For perhaps even better conductivity, a layer of metal, such as titanium-silver, titanium-gold or chromium, may be applied to the layer 16 by known methods. After front contacts have been applied, an operative silicon solar energy cell will have been formed.

An important feature of the present invention is the use of aluminum to form both the back junction 15 and the electrically conductive coating 16. While I have found that aluminum is an operative metal, it will be understood that it has been impossible to test all metals and compounds that might perform in the same or even a superior manner to aluminum. So while I have determined that boron, gallium, indium, cadmium, zinc, gold and manganese are not useful substitutes for aluminum, there may be metals and compounds that by simple experimentation may prove to be equivalent to aluminum for the purpose of my herein-described process and product.

Since reference has been made herein to a specific embodiment of my invention for the purpose of illustration only, all use of equivalent materials and obvious alterations and modification of the described embodiment are desired to be included within the purview of that invention, which I desire to be limited only by the scope, including equivalents, of the following, appended claims.

I claim:

1. A silicon wafer adapted for use in forming a silicon solar energy cell, comprising a relatively thin, substantially flat wafer of crystalline silicon having opposed front and back surfaces, a zone of diffusant extending into the wafer from the front surface thereof and forming an electrical junction in said wafer, and another zone composed of aluminum and silicon extending into said wafer from the back surface thereof and forming another junction therein, said zones being of opposite polarities and being separated by a zone of substantially undiffused silicon, and an electrically conductive film containing aluminum, oxygen and diffusant contiguous with said back surface of said wafer.

2. A silicon wafer as claimed in claim 1, in which a coating of electrically conductive metal is contiguous with the aluminum-oxygen-diffusant film on the back surface of the wafer.

3. A silicon wafer as claimed in claim 2, in which said metal is selected from the group consisting of titanium-silver, titanium-gold and chromium.

4. A silicon wafer as claimed in claim 1, in which said diffusant is phosphorus and said back surface film is comprised of aluminum, oxygen and phosphorus.

5. A silicon wafer as claimed in claim 1, in which a film of diffusant glass is formed on the front surface of the wafer.

* * * * *